United States Patent
Kelley et al.

(10) Patent No.: US 8,812,068 B1
(45) Date of Patent: Aug. 19, 2014

(54) METHOD OF NITRIDING NIOBIUM TO FORM A SUPERCONDUCTING SURFACE

(71) Applicant: Jefferson Science Associates, LLC, Newport News, VA (US)

(72) Inventors: Michael J. Kelley, Newport News, VA (US); John Michael Klopf, Hampton, VA (US); Senthilaraja Singaravelu, Nashville, TN (US)

(73) Assignee: Jefferson Science Associates, LLC., Newport News, VA (US)

( * ) Notice: Subject to any disclaimer, the term of this patent is extended or adjusted under 35 U.S.C. 154(b) by 115 days.

(21) Appl. No.: 13/651,619

(22) Filed: Oct. 15, 2012

Related U.S. Application Data

(60) Provisional application No. 61/627,925, filed on Oct. 20, 2011.

(51) Int. Cl.
| | |
|---|---|
| *H01L 39/24* | (2006.01) |
| *H05H 7/20* | (2006.01) |
| *H01P 7/06* | (2006.01) |
| *H01J 23/20* | (2006.01) |

(52) U.S. Cl.
USPC .......................... 505/210; 505/473; 315/500

(58) Field of Classification Search
CPC ............ H05H 7/18; H05H 7/20; H05H 9/00; H01J 23/20; H01L 39/24; H01L 39/2406; H01L 39/2409; H01L 39/249

USPC .............. 505/200, 210, 300, 325, 473, 480; 315/500, 502, 505; 148/96, 98, 223; 29/599

See application file for complete search history.

(56) References Cited

U.S. PATENT DOCUMENTS

| | | | | |
|---|---|---|---|---|
| 4,746,373 | A * | 5/1988 | Yamada et al. | 419/8 |
| 4,857,360 | A * | 8/1989 | Halbritter et al. | 427/62 |
| 6,918,172 | B2 | 7/2005 | Wong | |
| 7,151,347 | B1 * | 12/2006 | Myneni et al. | 315/500 |
| 2003/0227349 | A1 * | 12/2003 | Matsui et al. | 333/99 S |

OTHER PUBLICATIONS

Peng et al, "Fabrication and study of sputtered NbN thin films," PMID:16097665[PubMed]; Apr. 25, 2005 (4):487-90.*

* cited by examiner

*Primary Examiner* — Stanley Silverman
*Assistant Examiner* — Kallambella Vijayakumar

(57) ABSTRACT

A method of forming a delta niobium nitride δ-NbN layer on the surface of a niobium object including cleaning the surface of the niobium object; providing a treatment chamber; placing the niobium object in the treatment chamber; evacuating the chamber; passing pure nitrogen into the treatment chamber; focusing a laser spot on the niobium object; delivering laser fluences at the laser spot until the surface of the niobium object reaches above its boiling temperature; and rastering the laser spot over the surface of the niobium object.

12 Claims, 4 Drawing Sheets

METHOD OF NITRIDING NIOBIUM TO FORM A SUPERCONDUCTING SURFACE

This application claims the benefit of U.S. Provisional Application No. 61/627,925 filed on Oct. 20, 2011 for "Enhanced Superconducting Surface for Nb SRF Cavities Obtained by Gas Laser Nitriding" incorporated herein by reference in its entirety.

The United States government may have certain rights to this invention under Management and Operating Contract No. DE-AC05-06OR23177 from the Department of Energy.

FIELD OF INVENTION

The present invention relates to a method for producing a superconducting surface on niobium and more particularly to a method for producing a superconducting surface on niobium SRF (i.e. superconducting radio frequency) cavities.

BACKGROUND OF THE INVENTION

Particle accelerators are a key tool for scientific research ranging from fundamental studies of matter to analytical studies at light sources. Cost-for-performance is critical, both in terms of initial capital outlay and ongoing operating expense, especially for electricity to operate the accelerators.

Typically niobium is used to form the superconducting radiofrequency (SRF) accelerator cavities at the heart of many particle accelerators. Presently niobium SRF cavities operate near 1.9 K, well below the 4.2 K atmospheric boiling point of liquid helium to obtain sufficient performance. Thus, significant electric power costs are incurred in operating the SRF cavities at 1.9 K.

More particularly, the BCS surface resistance of niobium at 1.3 GHz decreases from about 800 n$\Omega$ at 4.2 K to 15 n$\Omega$ at 2 K. The quality factor $Q_0$ ($2\pi$ times the ratio of stored energy to energy loss per cycle) is inversely proportional to the surface resistance and may exceed $10^{11}$. Thus, the strong temperature dependence is the reason why operation at 1.8-2 K is essential for achieving high accelerating gradients in combination with very high quality factors. Superfluid helium is an excellent coolant owing to its high heat conductivity. However, the thermal conductivity of niobium at cryogenic temperatures is strongly temperature dependent and drops by about an order of magnitude when lowering the temperature to ~2 K.

Niobium nitride is known to have multiple crystalline forms including $\delta$-NbN (a face center cubic (i.e. fcc) crystal form) and $\epsilon$-NbN (hexagonal close packed (i.e. hcp) crystal form). Nb—N phase diagram was reported quite some years ago. The $\delta$-NbN extends from ~42 to 50 atomic percent nitrogen and is superconducting. In the prior art, the fcc $\delta$-NbN phase, which is superconducting converts, to the hcp $\epsilon$-NbN phase upon cooling below 1300° C., and $\epsilon$-NbN is not superconducting. Furnace nitriding studies have not been able to obtain $\delta$-NbN. Moreover furnace nitriding would require exposing the complete SRF cavity to an aggressive time-temperature history, risking mechanical distortion. Rapid thermal processing with a pulsed heat lamp of Nb films on Si in nitrogen yielded some $\delta$-NbN but a method of preparing a layer substantially composed of $\delta$-NbN and/or on the interior surface of a niobium SRF cavity has not been reported.

The use of a layer of niobium nitride for passivating niobium SRF cavities has been described in U.S. Pat. No. 7,151,347. Niobium SRF cavities are typically fabricated from high purity niobium sheet or cast plate, but often the quality factors at high gradients degrade over time for cavities produced by these methods. Such degradation appears to be affected by adherent surface oxide layers, trapped hydrogen and/or interactions between interstitial oxygen and hydrogen in the niobium material. Passivating niobium cavities with a layer of niobium nitride to reduce the negative effects of these gases and impurities is one approach for addressing these problems. However, the NbN layer obtained in the passivating process is $\epsilon$-NbN which achieves the passivating objectives but does not contribute enhanced superconductivity properties.

P. Schaaf reported laser gas nitriding of iron, aluminum and titanium, but there appears to have been no work on a solid niobium surface.

Alternatives that would permit operation and sufficient performance of niobium SRF cavities at higher temperatures would be highly desirable.

SUMMARY OF THE INVENTION

The invention provides a method of forming a delta niobium nitride ($\delta$-NbN) layer on the surface of a niobium object. The method includes cleaning the surface of the niobium object; providing a treatment chamber; placing the niobium object in the treatment chamber; evacuating the chamber wherein oxygen and air are removed from treatment chamber; passing pure nitrogen ($N_2$ 99.999% purity) gas into the treatment chamber at a pressure of at least 450 Torr; focusing a laser spot on the niobium object; delivering laser fluences at the laser spot in the range of 2.5 J/cm$^2$ to 6.0 J/cm$^2$ until the surface of the niobium object reaches above its boiling temperature; and moving the laser spot over the surface of the niobium object until the surface has been reacted with the nitrogen gas to form a niobium nitride ($\delta$-NbN) layer on the surface. The method provides that the niobium nitride formed on the surface is $\delta$-NbN (face centered cubic NbN) that is stable at temperatures below 1300° C. and that the $\delta$-NbN forms a layer of $\delta$-NbN that is superconducting at about 17° K.

The invention further provides a method of nitriding an interior surface of a niobium SRF cavity and a niobium SRF cavity having an interior surface coated with a layer of niobium nitride wherein said niobium nitride is $\delta$-NbN (face centered cubic NbN).

DETAILED DESCRIPTION OF INVENTION

Figure 1:
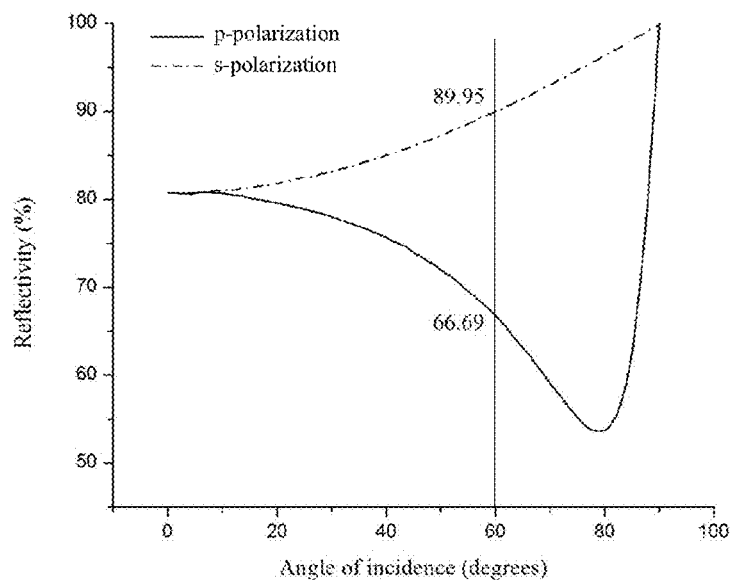
FIG. 1 is a plot of reflectivity of niobium at 1064 nm as a function of incidence angle.

The invention provides a gas/laser method for transforming the surface of a niobium object to produce a layer of δ-NbN on the surface of the niobium object. The δ-NbN layer produced by the method of the invention is stable at temperatures below 1300° C. including ambient temperatures (ca. 25° C.) and temperatures below 20° K.

While the method of the invention may be applied to any niobium surface, it is particularly useful for the interior surfaces of niobium cavities used in SRF accelerators. Using the method of the invention for transforming the interior surface of a niobium SRF cavity to comprise a layer of δ niobium nitride (δ-NbN) with a critical temperature ($T_c$)≅17 K instead of the 9.2 K of pure niobium, will permit the use of higher operating temperatures in accelerators having niobium cavities coated with a layer of niobium nitride on the inner surface and thus a substantial cryogenics cost savings and simplification of engineering.

The thickness of the δ NbN layer is preferably greater than the London penetration depth for NbN. The London penetration depth for bulk Nb is reported to be ~40 nm, and it is assumed that the London penetration depth for δ-NbN is approximately the same as that for bulk Nb.

As used herein "δ niobium nitride" (i.e. "δ-NbN" or "delta niobium nitride") is niobium nitride having an fcc (face centered cubic) crystal structure. δ Niobium nitride (δ-NbN) is superconducting at about 17° K.

As used herein "ε niobium nitride" (i.e. "ε-NbN") is niobium nitride having a hexagonal close packed (i.e. hcp) crystal form. ε-NbN is not superconducting.

As used herein "nitriding" is the process of modifying the surface of a material to produce a nitride composition on that surface. Nitriding niobium means reacting the surface of a niobium object with nitrogen gas to form a layer of niobium nitride. In a preferred embodiment the niobium nitride is δ-NbN that is stable (i.e. does not convert to other crystal forms and/or decompose) at temperatures below 1300° C. including ambient temperatures (ca. 25° C.) and temperatures below 20 K.

As used herein a "rapid quench" means a process that provides for retention of crystalline structure of a chemical composition as formed in a chemical reaction with cooling and the absence of conversion of the initial crystal structure to another crystalline form subsequent to the initial formation. Typically this is accomplished with very rapid cooling immediately after formation of the δ-NbN chemical composition. A chemical composition subjected to rapid quench as defined herein maintains the initial crystalline structure over a range of temperatures including ambient and supercooled temperatures below 20 K. Rapid quenching occurs on the surface of a material treated with a laser pulse if the bulk of the material has a much greater thermal capacity than the volume of surface treated by the laser pulse and the thermal conductivity of the bulk material is high enough to provide a sufficiently fast thermal conduction path. Most metals, including Nb, have high thermal conductivity. Thus, a small laser spot and shallow absorption depth makes the volume of the laser heated region very small. As a result, a bulk Nb structure provides the heat sink required for the rapid quenching. This is in contrast to thin film structures which have reduced thermal capacity and thermal conduction.

In a preferred embodiment the niobium surface is heated to just above the boiling temperature of niobium and then cooled rapidly, i.e. subjected to rapid quench, to avoid the δ→ε conversion of NbN. Computational modeling is used in some embodiments to predict the time course of the surface temperature as a function of the laser irradiation parameters to identify the most promising range of parameters to guide selection of experimental conditions.

In the practice of the invention laser energy is deposited in a surface layer of niobium, the thickness of the surface layer is given by the penetration depth ($d=\lambda/4\pi\kappa$) and absorption coefficient ($\alpha=1/d$). For example, at 1064 nm, $\kappa=5.09$ for niobium. Reflectivity (R) of the metals depends upon the angle of incidence ($\theta$), plane of polarization and wavelength ($\lambda$) of the laser beam. The reflectivity at any given angle with different polarizations can be calculated by the Fresnel equations. FIG. 1 is a plot showing the reflectivity of niobium ($\lambda=1064$ nm) as a function of the angles of incidence and polarization.

For a laser such as a Q-switched YAG laser, which is exemplary of lasers suitable for use in the practice of the invention, the pulse duration ($\tau_p=15$ ns) is much longer than the electron collision frequency of the niobium ($\tau_e\cong 60$ ps), so that a thermal Fermi distribution can be assumed for the electrons. Thus, the absorption of laser light energy by the bulk material can be described by Fourier heat conduction equations. Further an exemplary laser spot for a Q-switched YAG laser ($\cong 80$ μm) is much larger than the thermal diffusion length ($\approx$nm), justifying use of a 1D diffusion equation. Thus, the heat flow in niobium can be represented by the following equation $$\frac{\partial T(z,t)}{\partial t} - \frac{\partial}{\partial z}\left(k(T)\frac{\partial T(z,t)}{\partial z}\right) = \frac{A(z,t)}{\rho(T)c_p(T)} \qquad (1)$$

where $T(z,t)$ is temperature at depth z at time t, $\rho$ is mass density, $k(T)=k'/\rho c_p(T)$ is thermal diffusivity, k' is specific thermal conductivity, $c_p(T)$ is specific heat capacity and $A(z,t)$ is the heat generation which can be written as $$A(z,t)=\alpha I(t)(1-R)\exp(\alpha z)+\Delta U(z,t) \qquad (2)$$

where $\alpha$ is the absorption coefficient, R is the reflectivity, $\Delta U(z,t)$ is the internal heat sinks (phase transformation) and $I(t)=I_o\exp^{-(t-t_o)^2/2\sigma^2}$ which describes the Gaussian temporal laser pulsed profile. For an exemplary embodiment of the invention the parameters were selected as, $\sigma=6.37$ ns (for 15 ns FWHM), and $I_o=H/\sqrt{2\pi\sigma}$ (H is fluence in J/cm$^2$). The reflectivity for niobium for the wavelength 1064 nm at an angle of 60° is 0.67 for parallel polarization and 0.90 for perpendicular polarization.

As there is no analytical solution for the Equation 1 with temperature dependent material properties, the finite differences method (forward difference approximation) may be used to solve Equation 1. Time (t) and space (z) are divided equally like, $t^i=i\Delta t$ (where i=0 ... M) and $z_n=n\Delta z$ (where n=0 ... N). Defining the function T whose value $T^i$ is known at the discrete points, the approximation of first and second order partial derivatives at point i can be written as, $$\frac{\partial T}{\partial t} = \frac{T^{i+1}-T^i}{\Delta t}; \text{ and } \frac{\partial^2 T}{\partial z^2} = \frac{T_{n-1}-2T_n+T_{n+1}}{(\Delta z)^2} \qquad (3)$$

where $T_n^i$ is the temperature at the time $t^i=i\Delta t$ in the layer $z_n=n\Delta z$. The calculation starts at i=0 with $T_n^0=300$ K for all n. Evaluation of the first order derivative with respective to time, the second order with respect to direction (here z direction), and substituting these in Equation 1, it can be rewritten as Equation 4, which is also called forward time centered space scheme.

$$T_n^{i+1} = T_n^i + \Delta t \cdot \left[ \frac{k_n^i}{(\Delta z)^2}(T_{n-1}^i - 2T_n^i + T_{n+1}^i) + \frac{A_n^i}{\rho c_{\rho,n}^i} \right] \quad (4)$$

To satisfy the Neumann stability criterion $((\Delta z)^2/\Delta t \geq 0.5 \, k)$, $\Delta z$ and $\Delta t$ were set as $\Delta z = 7.5$ nm and $\Delta t = 0.5$ ps.

Figure 2:
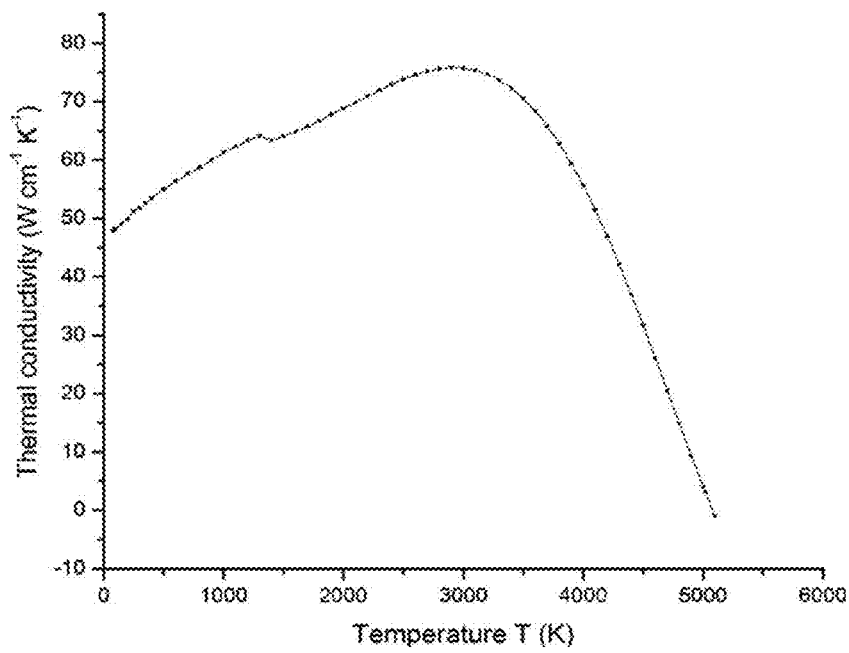
FIG. 2 is a plot of thermal conductivity of niobium as a function of temperature.
Figure 3:
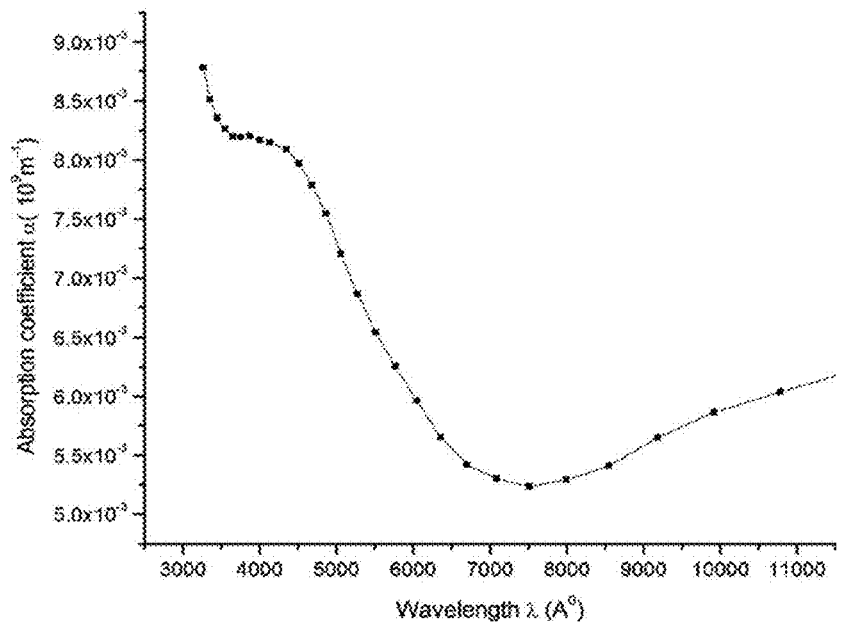
FIG. 3 is a plot of absorption coefficient of niobium as a function of wavelength.

Using computational modeling, the thermo-physical properties of niobium were extrapolated to 5100 K, just above its boiling temperature. The boiling temperature is considered independent of pressure in the range of operation of the invention. Calculated thermal conductivity for niobium as a function of temperature is plotted in FIG. 2. FIG. 3 shows the absorption coefficient of niobium vs wavelength. A simulation for the surface temperature was done using C++ using Equation 4. Other thermal parameters used in simulation are shown in Table I.

Table I: Material Parameters Used in the Simulation Calculation to Calculate Surface Temperature Rise of Niobium

| Parameter | Value |
|---|---|
| Penetration Depth (d) | 16.633 nm |
| Melting point ($T_m$) | 2740K |
| Boiling point ($T_b$) | 5017K |
| Critical temperature ($T_c$) | 12500K |
| Density ($\rho$) | 8.57 g/cm$^3$ |
| Molar Mass (M) | 92.9063 g/mol |
| Enthalpy of fusion ($E_f$) | 26.94 kJ/mol |
| Enthalpy of vaporization ($E_v$) | 696.6 kJ/mol |

Figure 4:
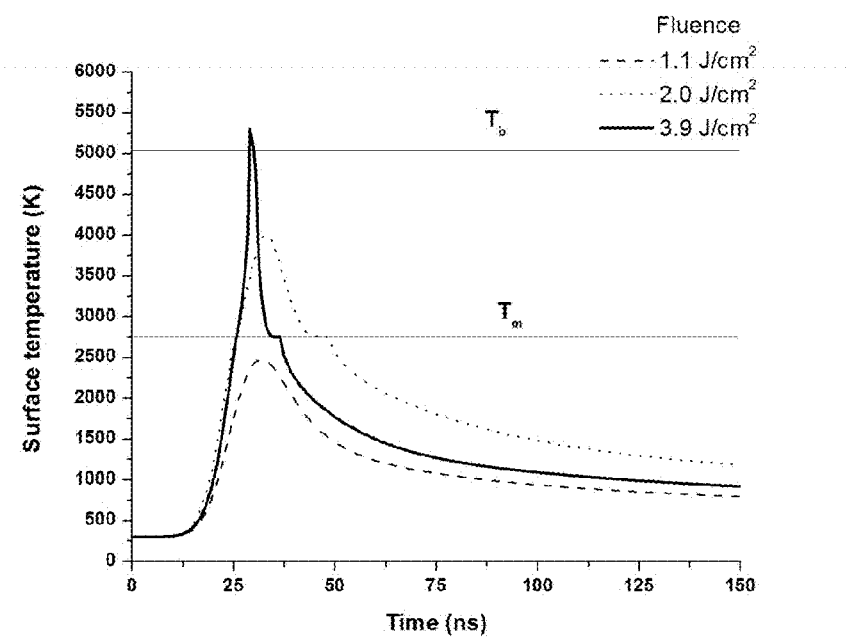
FIG. 4 is a plot of calculated time dependence of niobium surface temperature irradiated by a single 15 ns pulse of the indicated fluence.

FIG. 4 shows the computed results of the surface temperature of niobium vs time for a single laser pulse of various fluences.

The surface temperature calculation predicts that niobium surface melting starts at about 1.3 J/cm$^2$, and the boiling temperature is reached at 2.1 J/cm$^2$. To produce the superconducting δ-NbN, the experimental results suggest that that an important experimental parameter is the fluence required to bring the surface temperature just above the boiling point to facilitate reaction with the nitrogen atmosphere. The thickness of the nitride layer is expected to increase with dwell time above melting, so fluences above 2.1 J/cm$^2$ were selected in an exemplary embodiment.

In one exemplary embodiment a PVD Products Inc. PLD 5000 system (Wilmington, Mass.) was used produce niobium nitride on the surface of a niobium object.

Figure 5:
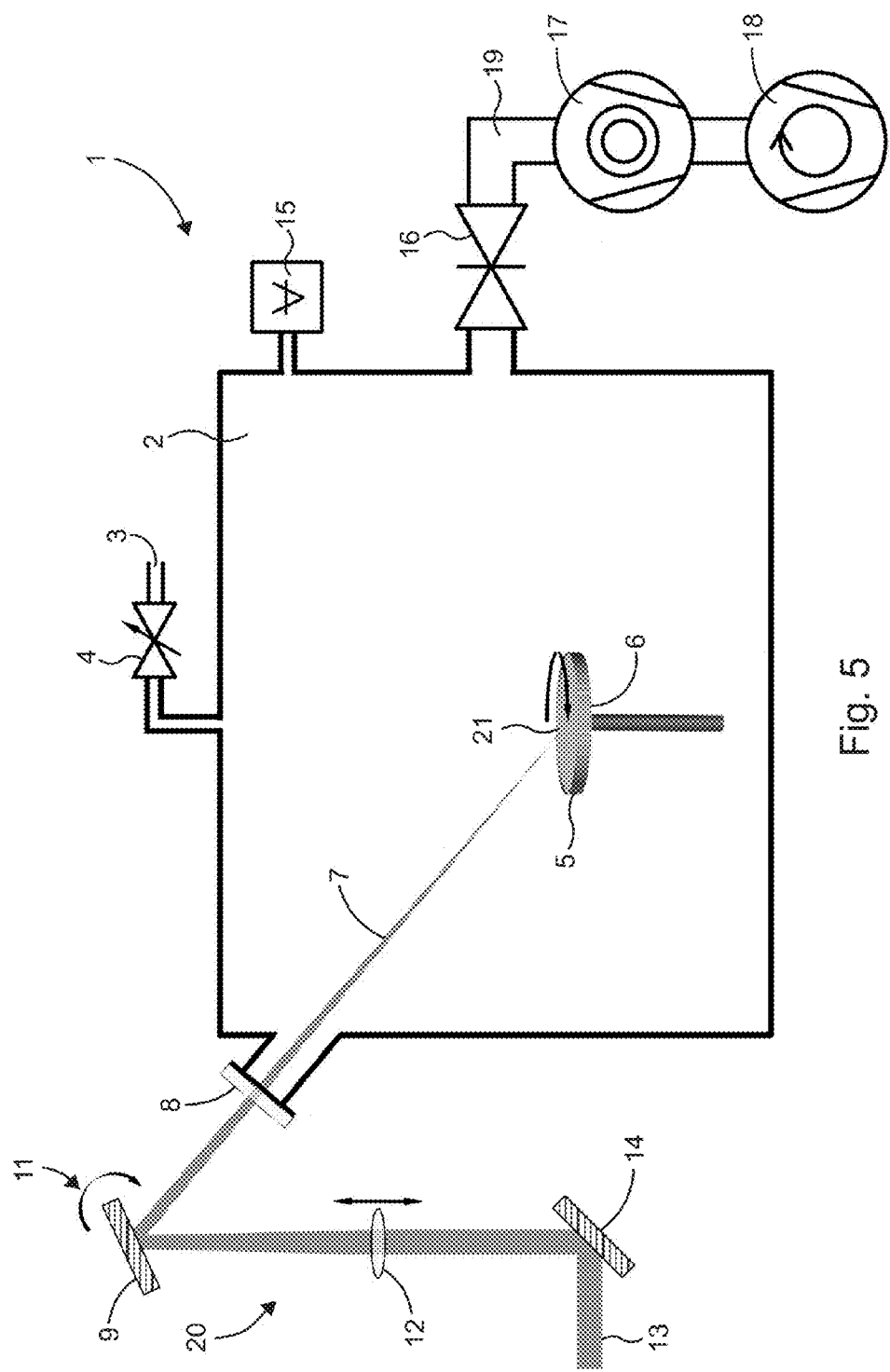
FIG. 5 is a schematic diagram of an exemplary embodiment of an apparatus for nitriding niobium.

A schematic representation the exemplary embodiment is shown in FIG. 5. Referring to FIG. 5, the exemplary apparatus 1 comprises a vacuum chamber 2, which may be evacuated to a pressure of 10$^{-6}$ Torr or lower to remove air and in particular oxygen. Evacuation is accomplished using turbomolecular pump 17 and foreline pump 18 via vacuum line 19 and vacuum valve 16. Vacuum gauge 15 is used to monitor the pressure during and after evacuation. Niobium sample 5 is positioned on sample holder 6. Sample holder 6 is equipped with the ability to rotate at a selected speed. In the schematic diagram of FIG. 5 only one sample holder 6 and niobium object 5 is shown. In some embodiments a plurality of sample holders 6 (and accordingly a plurality of niobium objects 5) may be positioned in vacuum chamber 2. After evacuation, pure nitrogen (nitrogen gas (N$_2$) with a purity of 99.999%) is admitted to the vacuum chamber 2 via nitrogen line 3 and metering valve 4. Optical train 20 transfers, focuses, and rasters a pulsed laser beam 13 into the vacuum chamber 2 providing a focused laser beam 7 on the surface of niobium sample 5. The pulsed laser beam is provided by a pulsed laser such as a Q-switched YAG Laser (laser not shown in FIG. 5). The pulsed beam is directed by mirror 14 and focused by focusing lens 12 to a rastering mirror 9 that rasters the focused laser beam 7 and directs focused laser beam 7 though the vacuum laser window 8 into vacuum chamber 2 and onto the surface of niobium sample 5 where the focused laser beam is rastered across the surface 21 to be nitrided of niobium sample 5. As one skilled in the art will appreciate other arrangements of an optical train 20 with additional focusing and/or directional components and/or other rastering mechanism may likewise be suitable for use in the invention so long as a focused laser beam 7 is directed to the surface 21 to be nitrided of the niobium sample 5 and there is a mechanism for rastering the beam over the niobium sample surface 21 to be nitrided.

In an exemplary embodiment the vacuum chamber 2 was evacuated by pumps 17, 18 to a pressure of 10$^{-7}$ Torr to remove substantially all oxygen from the vacuum chamber 2. Following evacuation, the chamber was backfilled with nitrogen gas of a purity of 99.999% to a maximum chamber pressure of 620 Torr of nitrogen in the exemplary embodiment (i.e. various pressures were used but none exceeded 620 Torr in the exemplary embodiment). The laser beam was positioned incident at an angle of 60° from normal of the niobium sample 5 positioned on sample holder 6 and the sample holder 6 with sample 5 was rotated. A Q-switched YAG laser was used to produce thermal energy for nitriding the surface 21 of the niobium sample 5. More specifically a Spectra Physics (Santa Clara, Calif.), "High Intensity Peak Power Oscillator" (HIPPO) nanosecond laser ($\lambda$=1064 nm, $E_{max}$=0.430 mJ, $\tau_p$=15 ns,) is exemplary of a laser suitable for use in the practice of the invention. Laser fluences in the range 2.5 J/cm$^2$ and 6 J/cm$^2$ per pulse were delivered, to heat the exposed niobium surface to above its boiling temperature. Under the conditions used in the exemplary embodiment beam spot was about 80 μm.

In the exemplary embodiment, a mirror was placed within the optical train to raster the laser beam over a radial range on the target up to ~1.8 inch. All target pedestals/sample holders were 50 mm in diameter and configured to rotate independently of the other sample holders. For the exemplary embodiment, the maximum rotation speed of the sample holders was 12 rpm. In one exemplary embodiment, three bare niobium discs were placed on the three solid target pedestals and the rotation speed was maintained the same for the entire nitriding procedure as the laser beam was rastered to modify entire regions of the Nb surface of each sample.

In one exemplary embodiment, the niobium discs (50 mm in diameter, 2-3 mm thickness) were cut from sheet stock niobium of the type used for SRF cavities. The niobium disc surfaces were cleaned using buffered chemical polishing (BCP) to clean the surface. The BCP mixture used was the traditional 1:1:2 ratio of hydrofluoric acid (49%), nitric acid (69.5%), and phosphoric acid (85%). A layer of about 10 microns was removed from the surface of each disc in the cleaning process.

These cleaned niobium discs were placed in the sample holders, the chamber was pumped down to 10$^{-7}$ Torr and then pure nitrogen gas (99.999%) was passed into the chamber at a pressure ranging from 450 Torr to 620 Torr. The laser irradiation was carried out in this atmosphere. The target rotation was kept constant at 9 rpm. The rastering mirror was programmed to scan in such a way that the laser irradiated concentric circles on the niobium target, where reaction with nitrogen gas was intended to form δ-NbN. The combination of the experimental parameters produced concentric circles (graded treatment) on the niobium surface. Thus the total number of pulses (same energy per pulse) was inversely proportional to radius of the rings, yielding a varying thickness of NbN layer across the nitrided area. Each irradiated ring was subjected to a total laser pulse number per unit area in the range of 40 (outer diameter) to 200 (inner diameter).

Characterization of the NbN Surface

The niobium samples subjected to the method of the invention were examined by scanning electron microscopy (SEM), electron probe microanalysis (EPMA) and x-ray diffraction (XRD). The SEM images show a sharp transition with fluence from a smooth, undulating topography to significant roughening, with roughening interpreted as the onset of ablation. EPMA measurements found a constant value of the nitrogen/niobium atom ratio to depths greater than the SRF active layer thickness. Selected irradiation conditions resulted in atomic ratio values consistent with formation of δ-NbN, and XRD data indicated only δ-NbN on top of the niobium metal.

The crystal structure of the surface was determined by X-Ray Diffraction (XRD) using a Panalytical (Westborough, Mass.) X'Pert instrument with Co Kα radiation. Phases on the surface were identified by matching the diffraction peaks with the JCPDS (Joint Committee on Powder Diffraction Standards) card. The surface topography was investigated by FE-SEM (Hitachi (Gaithersburg, Md.) 4700 SEM/EDX). This was also used to examine in cross-section the thickness of the NbN layer on Nb. The concentration of nitrogen in the niobium was investigated by Energy Dispersive X-Ray Spectroscopy (EDS) on the SEM and Wavelength Dispersive X-ray Spectrometry on the EPMA.

The SEM images showed a laser pattern in the form of concentric circles on the nitrided (treated) niobium surface. For the niobium samples treated with 60 total laser pulses/unit area, the images showed that niobium had reached just above the boiling temperature of niobium. At this temperature, the niobium reacted with nitrogen and underwent rapid resolidification to form niobium nitride and the surface did not visibly ablate, i.e. roughness after treatment was at the nanometer-scale. When the total number of pulses per unit area was increased to 150, the niobium surface visibly ablated resulting in micron-scale roughness.

A cross section of niobium sample with a δ-NbN layer was also examined by SEM, to view the nitrided layer and the bulk niobium. Elemental analysis to differentiate the nitrided part and the niobium part was performed by energy dispersive x-ray spectroscopy (EDS) in the SEM. The nitrided layer had the signature of nitrogen and niobium, whereas the niobium region had just the signature of niobium alone. By the scale on the image, the thickness of the nitrided area was measured at about 10 microns which is greater than the London penetration depth.

Figure 6:
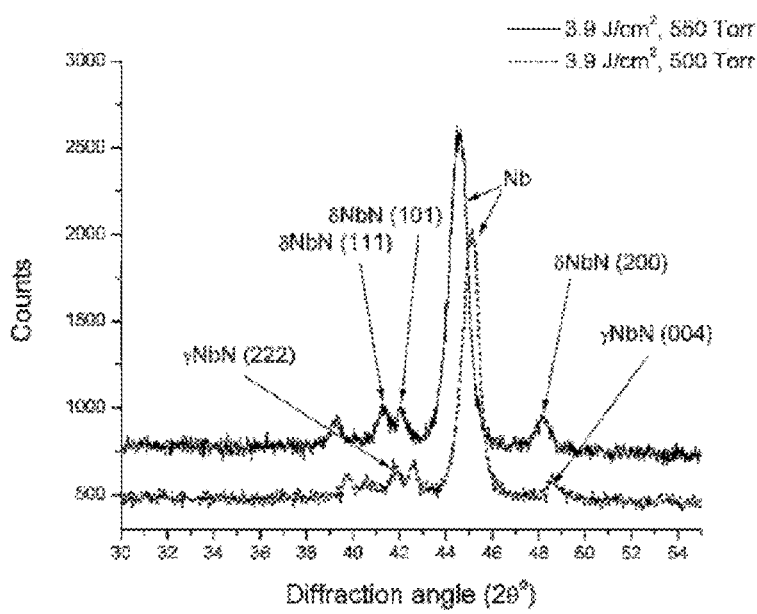
FIG. 6 is an X-ray Diffraction (XRD) spectra showing the presence of different phases of NbN in different samples and presence of $\delta$-NbN in a sample reacted a 550 Torr $N_2$.

FIG. 6 shows the XRD patterns of niobium samples treated under different conditions. The XRD patterns show the presence of different NbN phases depending on treatment conditions. The superconducting δ-NbN, phase (show as a solid line in FIG. 6) was formed on a niobium sample using parameters of repetition rate of 25 KHz, $N_2$ pressure 550 Torr, laser power 9.8 W, Fluence 0.392 $J/cm^2$, and total number of pulses 60-210) and these results have been shown to be reproducible.

Figure 7:
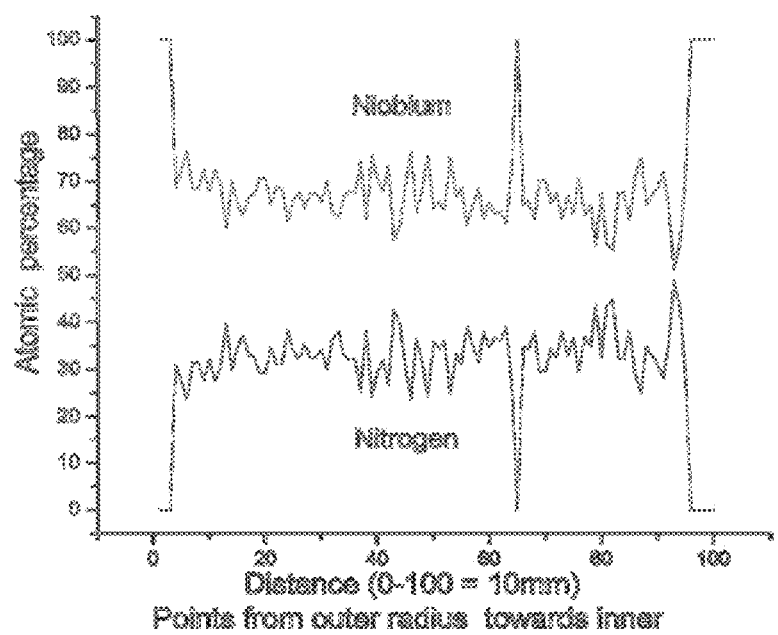
FIG. 7 is a plot showing radial dependence of atomic concentration of Nb (upper trace) and N (lower trace) for a treated niobium sample in which $\delta$-NbN was formed.

The total accumulated pulses varied as a function of radius for all samples. To explore for any effect on composition, the N and Nb content of a sample having a δ-NbN layer were determined by EPMA along a radius (see FIG. 7). The values are constant. They are plotted as atomic percent, uncorrected for all instrument effects. To calibrate these values, the ratio apparent atomic percent of N and Nb in NbN was determined with reference material (Alfa Aesar 12146). The ratio of the reference material was found to be 0.69, the same as in the plots for the sample.

The surface temperature simulation results were consistent with measured threshold for laser nitriding as indicated by the NbN peaks detected in the XRD data. The simulation (shown in FIG. 4) predicts that delivering a single pulse of fluence greater than 2 $J/cm^2$ to a Nb surface, raises the surface temperature of the niobium to the boiling temperature. Thus it was expected that niobium would react with nitrogen atmosphere forming NbN only when the fluence is more than 2 $J/cm^2$ (i.e., when the niobium surface reaches its boiling point). The XRD analysis provided experiment evidence supporting this assumption as NbN peaks only appeared when the fluence was above 2 $J/cm^2$. Further the analytical data showed δ-NbN alone was found at a fluence of 3.9 $J/cm^2$ and nitrogen pressure of 550 Torr.

Thus, the analytical data showed that the method of the invention using rapid thermal treatment with a nanosecond laser and rapid quench of NbN product produced successful nitriding of niobium to give a superconducting niobium nitride (δ-NbN) surface. The atomic concentration of N and Nb did not change drastically with the change of number of pulse overlaps per area. However it may be preferable to use a lesser number of pulses overlapped per area as the use of a lesser number of pulses produced less roughness (surface looks smoother), than did a higher number of pulses. The inventors believe without wishing to be held to the theory that the rapid quench, i.e. a high cooling rate applied immediately after the formation of δ-NbN is important for the formation of phase-pure δ-NbN and avoiding conversion of δ-NbN to the non-superconducting hexagonal ε-NbN phase.

The invention has been described above in relation to the use of niobium discs as samples. The method of the invention is likewise applicable to nitriding the interior surface of a formed niobium SRF cavity. The optics of the optic train would need to be designed to direct a focused laser beam into the cavity through a cavity orifice and designed to accommodate rastering the focused beam over the interior surface of the cavity. Methods of directing and rastering focused laser beams are well known to one skilled in the art.

The invention further comprises a niobium SRF cavity having a δ-NbN layer on the interior surface of the cavity. In one embodiment the δ-NbN layer is applied by the method described and claimed herein.

What is at present considered the preferred embodiment and alternative embodiments of the present invention has been shown and described herein. It will be obvious to those skilled in the art that various changes and modifications may be made therein without departing from the scope of the invention as defined by the appended claims.

What is claimed is:

1. A method of forming a delta niobium nitride (δ-NbN) layer on a surface of a niobium object including:
   a) cleaning said surface of said niobium object;
   b) providing a treatment chamber;
   c) placing said niobium object in said treatment chamber;
   d) evacuating said chamber wherein oxygen and air are removed from said treatment chamber;
   e) passing nitrogen gas into said treatment chamber at a pressure of at least 450 Torr;
   f) focusing a laser spot on said niobium object;
   g) delivering laser fluences at said laser spot in the range of 2.5 $J/cm^2$ to 6.0 $J/cm^2$ until said surface of said niobium object reaches above its boiling temperature; and h) moving the laser spot over said surface of said niobium object until said surface has been reacted with said nitrogen gas to form a delta niobium nitride (δ-NbN) layer on said surface.

2. The method of claim 1, wherein said niobium object includes a mass sufficient to rapid quench said delta niobium nitride (δ-NbN).

3. The method of claim 1, wherein the pressure of the nitrogen is 450 Torr to 600 Torr.

4. The method of claim 1, wherein said chamber is evacuated to a pressure of $10^{-6}$ Torr or less.

5. The method of claim 1, wherein the δ-NbN layer formed on said surface has a face centered cubic crystal form at temperatures below 1300° C.

6. The method of claim 1, wherein the is δ-NbN layer is superconducting at about 17 K.

7. A method of forming a delta niobium nitride (δ-NbN) layer on an interior surface of a niobium SRF cavity including:
   a) cleaning said interior surface of said niobium SRF cavity;
   b) providing a treatment chamber;
   c) placing said niobium SRF cavity in said treatment chamber;
   d) evacuating said vacuum chamber until all oxygen and air are removed from said treatment chamber;
   e) passing nitrogen gas into said treatment chamber at a pressure of at least 450 Torr;
   f) focusing a laser spot on said interior surface of said niobium SRF cavity;
   g) delivering laser fluences at said laser spot in the range of 2.5 J/cm2 to 6.0 J/cm2 until said surface of said interior surface reaches above its boiling temperature; and
   h) moving the laser spot over said interior surface until said interior surface has been reacted with said nitrogen gas to a form a delta niobium nitride (δ-NbN) layer on said interior surface.

8. The method of claim 7, wherein said niobium SRF cavity includes a mass sufficient to rapid quench said delta niobium nitride (δ-NbN).

9. The method of claim 7, wherein the pressure of the nitrogen is 450 Torr to 600 Torr.

10. The method of claim 7, wherein said chamber is evacuated to a pressure of $10^{-6}$ Torr or less.

11. The method of claim 7, wherein the δ-niobium nitride formed on said interior surface has a face centered cubic crystal form at temperatures below 1300° C.

12. The method of claim 7, wherein the niobium nitride is superconducting at about 17 K.

* * * * *